(12) United States Patent
Baik et al.

(10) Patent No.: US 8,212,623 B2
(45) Date of Patent: Jul. 3, 2012

(54) TERAHERTZ OSCILLATORS AND METHODS OF MANUFACTURING ELECTRON EMITTERS

(75) Inventors: Chan-wook Baik, Yongin-si (KR); Joo-ho Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 143 days.

(21) Appl. No.: 12/801,711

(22) Filed: Jun. 22, 2010

(65) Prior Publication Data

US 2011/0193638 A1  Aug. 11, 2011

(30) Foreign Application Priority Data

Feb. 9, 2010  (KR) .................. 10-2010-0012029

(51) Int. Cl.
*H03B 17/00* (2006.01)
(52) U.S. Cl. .................. 331/108 C; 331/3; 331/94.1
(58) Field of Classification Search ............. 331/3, 94.1, 331/108 C
See application file for complete search history.

(56) References Cited

U.S. PATENT DOCUMENTS

| 4,873,468 | A | 10/1989 | Miram et al. |
| 5,614,795 | A | 3/1997 | Kim |
| 6,801,091 | B2 * | 10/2004 | Atsumi et al. ............ 331/3 |
| 6,909,104 | B1 | 6/2005 | Koops et al. |
| 6,933,517 | B2 | 8/2005 | Chen et al. |
| 7,259,510 | B1 | 8/2007 | Gammel et al. |
| 2004/0108550 | A1 | 6/2004 | Jin |
| 2005/0006829 | A1 | 1/2005 | Chow et al. |
| 2006/0030066 | A1 | 2/2006 | Hantschel et al. |

FOREIGN PATENT DOCUMENTS

KR  96-35720  10/1996

* cited by examiner

*Primary Examiner* — James E Goodley
(74) *Attorney, Agent, or Firm* — Harness, Dickey & Pierce, PLC

(57) ABSTRACT

A terahertz oscillator may include a first insulating layer, an electron emitter on the first insulating layer, adapted to emit an electron beam, and including a cathode, an anode, an oscillating circuit, and a collector sequentially disposed, spaced apart from each other, on the first insulating layer in a direction in which the electron beam is emitted from the electron emitter, wherein the oscillating circuit converts energy of the electron beam to energy of an electromagnetic wave, and wherein the collector collects the electron beam, an output unit adapted to emit the electromagnetic wave from the oscillating circuit to outside of the terahertz oscillator, and an electron emitting material layer. The cathode may include a first curved portion that extends in a direction perpendicular to the first insulating layer. The electron emitting material layer may be on an inner surface of the first curved portion of the cathode.

18 Claims, 10 Drawing Sheets

TERAHERTZ OSCILLATORS AND METHODS OF MANUFACTURING ELECTRON EMITTERS

CROSS-REFERENCE TO RELATED APPLICATION(S)

This application claims priority from Korean Patent Application No. 10-2010-0012029, filed on Feb. 9, 2010, in the Korean Intellectual Property Office (KIPO), the entire contents of which are incorporated herein by reference.

BACKGROUND

1. Field

Example embodiments relate to terahertz oscillators and/or methods of manufacturing electron emitters for terahertz oscillators.

2. Description of the Related Art

A terahertz band between the microwave band and the optical band may be very important for applications in molecular optics, biological physics, medical science, spectroscopy, image processing, and/or security areas. However, there may be only a few currently developed terahertz oscillators and/or amplifiers operating in the terahertz band due to various physical and/or engineering limitations. Recently, such terahertz band oscillators and/or amplifiers may have been developed using new concepts and/or advances in micro-processing technologies. A variety of approaches may have been attempted in order to increase the frequency at which existing microwave band oscillators may operate and/or to lower the operating frequency of oscillators operating within a higher frequency band in order to be within the terahertz band using optical instruments such as a semiconductor laser and/or a femtosecond laser. Furthermore, recently, various attempts may have been made to fabricate a compact size terahertz oscillator using micro-processing technology.

SUMMARY

Example embodiments may provide terahertz oscillators and/or methods of manufacturing electron emitters for terahertz oscillators.

Additional aspects may be set forth in part in the description which follows and, in part, may be apparent from the description, and/or may be learned by practice of example embodiments.

According to example embodiments, a terahertz oscillator may include a first insulating layer, an electron emitter disposed on the first insulating layer, for emitting an electron beam, and/or including a cathode, an anode, an oscillating circuit, and a collector that may be sequentially disposed spaced apart from each other on the first insulating layer in the direction in which the electron beam may be emitted from the electron emitter, wherein the oscillating circuit may convert energy of the electron beam to energy of an electromagnetic wave, and/or wherein the collector may collect the electron beam, and/or an output unit adapted to emit the electron magnetic wave generated from the oscillating circuit to outside of the terahertz oscillator. The cathode may include a first curved portion that may be formed to have a curved shape that may extend in a direction perpendicular to the first insulating layer. An electron emitting material layer may be formed on an inner surface of the first curved portion.

The terahertz oscillator may further include a gate disposed between the cathode and the anode. The gate may include a gate hole formed through the gate. The electron beam emitted from the electron emitter may be transmitted through the gate hole.

The electron emitter may include the cathode including a first supporting portion disposed parallel to the first insulating layer, and/or a first curved portion that may extend from the first supporting portion in the direction perpendicular to the first insulating layer; a second insulating layer formed on an external surface of the cathode, and/or including a second supporting portion formed on an external surface of the first supporting portion and/or a second curved portion formed on an external surface of the first curved portion; and/or the electron emitting material layer formed on the inner surface of the first curved portion.

The electron emitter may further include an auxiliary electrode disposed on the first insulating layer in an opposite direction to the direction in which the electron may be emitted, in such a manner as to be spaced apart from the cathode.

A groove having a depth (that may or may not be predetermined) may be formed in the inner surface of the first curved portion of the cathode, and/or a pair of first and second protrusions that protrude towards the groove so as to face each other, and/or another pair of third and fourth protrusions that protrude towards the groove so as to face each other may be formed on the inner surface of the first curved portion. The first and second protrusions may be arranged in a direction perpendicular to a direction in which the third and fourth protrusions may be arranged. The electron emitting material layer may be disposed on a bottom surface of the groove.

The cathode may be a field emission type cathode, a thermionic electron emission type cathode, and/or an optical excitation electron beam cathode.

The electron emitter, the anode, the oscillating circuit, the collector, and/or the output unit may be configured on the first insulating layer in an on-chip type. The terahertz oscillator may further include a substrate disposed on a lower surface of the first insulating layer on which the electron emitter, the anode, the oscillating circuit, the collector, and/or the output unit may be disposed.

The terahertz oscillator may further include an electron emitter block having a height (that may or may not be predetermined) and/or disposed between the first insulating layer and the electron emitter. The terahertz oscillator may further include a third insulating layer formed on the electron emitter block.

The output unit may be formed in a portion of the first insulating layer that may be between the anode and the oscillating circuit, and/or may include a through hole connected out of the terahertz oscillator.

The anode may include an anode block including a plurality of first protrusions that may be arranged at regular intervals, and/or the oscillating circuit may include a plurality of second protrusions that may be arranged at regular intervals.

The first and second protrusions may be arranged parallel to each other in a direction perpendicular to the direction in which the electron beam may be emitted. An interval between the first protrusions may be greater than an interval between the second protrusions. An electron beam emitted from the electron emitter may pass above the first and/or second protrusions. The collector may include a collector block having a height (that may or may not be predetermined).

According to example embodiments, a method of manufacturing an electron emitter may include forming a sacrificial layer on a substrate, sequentially forming a first insulating material layer and a cathode material layer on the sacrificial layer and/or the substrate, and/or forming a first insulating layer and/or a cathode to be curved so as to have a curved portion that may extend in a direction perpendicular to the substrate by removing the sacrificial layer.

The first insulating layer and/or the cathode formed on the sacrificial layer may extend in the direction perpendicular to the substrate, and/or may be curved due to a stress difference between the first insulating material layer and the cathode material layer while the sacrificial layer may be removed.

The method may further include, prior to the forming of the sacrificial layer, forming a second insulating layer on the substrate. The method may further include, prior to the forming of the sacrificial layer, forming an auxiliary electrode on the substrate. For example, the sacrificial layer may be formed on the auxiliary electrode and/or the substrate.

According to example embodiments, a terahertz oscillator may include a first insulating layer, an electron emitter on the first insulating layer, adapted to emit an electron beam, and/or including a cathode, an anode, an oscillating circuit, and/or a collector sequentially spaced apart from each other on the first insulating layer in a direction in which the electron beam may be emitted from the electron emitter, wherein the oscillating circuit may convert energy of the electron beam to energy of an electromagnetic wave, and/or wherein the collector may collect the electron beam, an output unit adapted to emit the electromagnetic wave from the oscillating circuit to outside of the terahertz oscillator, and/or an electron emitting material layer. The cathode may include a first curved portion that may extend in a direction perpendicular to the first insulating layer. The electron emitting material layer may be on an inner surface of the first curved portion of the cathode.

According to example embodiments, a method of manufacturing an electron emitter may include forming a sacrificial layer on a substrate, sequentially forming a first insulating material layer and a cathode material layer on the sacrificial layer and the substrate, and/or forming a first insulating layer and a cathode to be curved so as to have curved portions that extend in a direction perpendicular to the substrate by removing the sacrificial layer.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
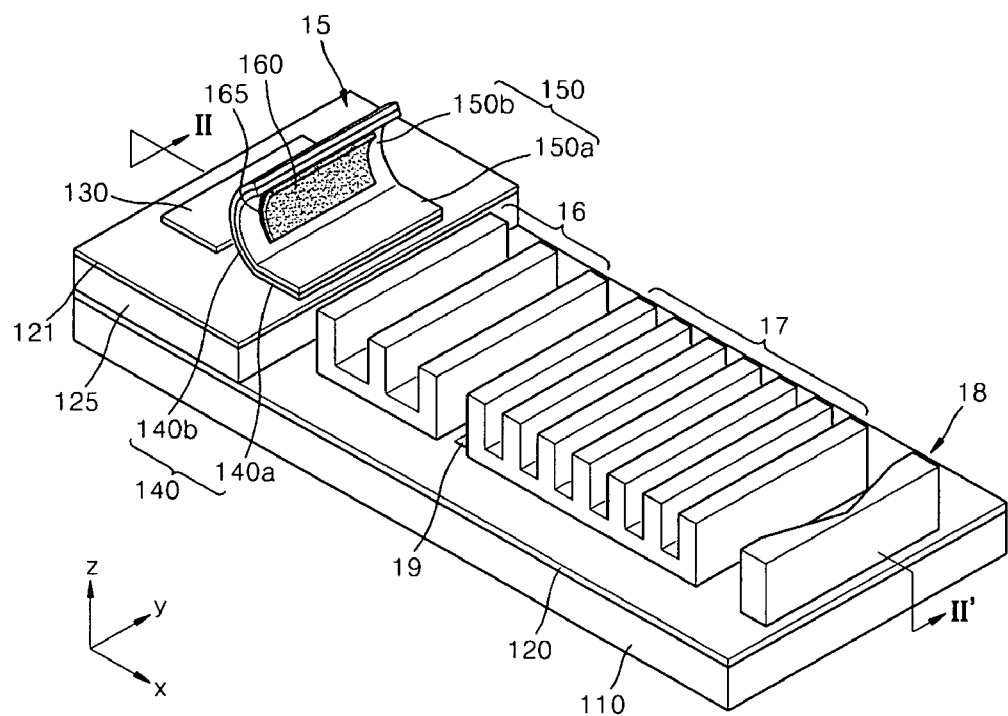
FIG. 1 is a perspective view of an on-chip type terahertz oscillator according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
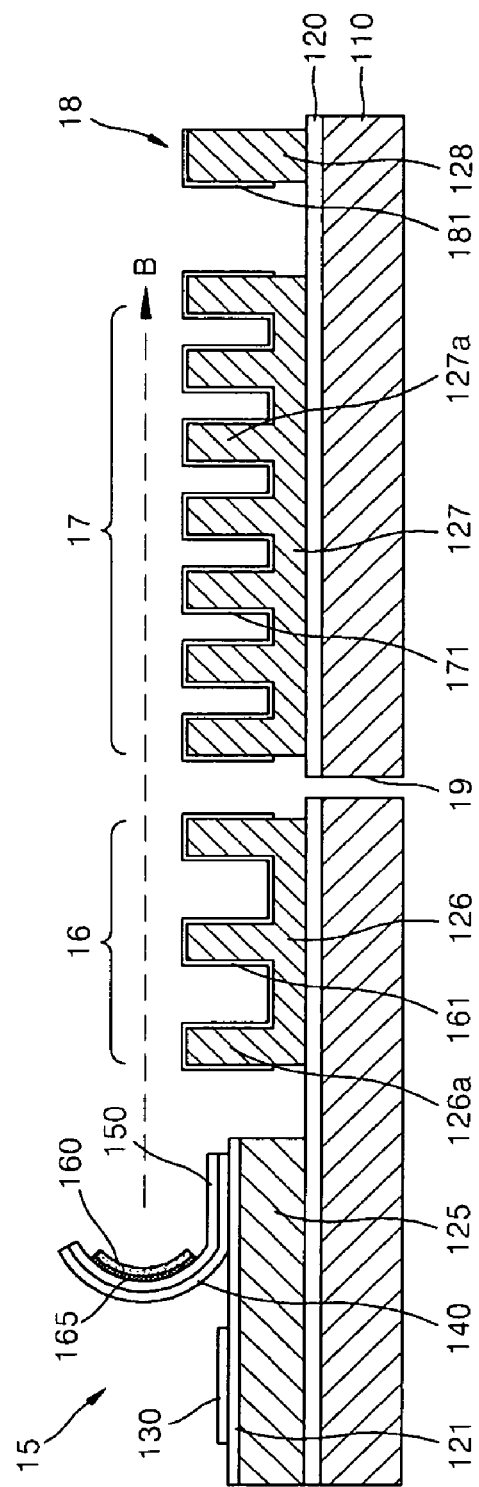
FIG. 2 is a cross-sectional view of the on-chip type terahertz oscillator taken long a line II-II' of FIG. 1.

FIG. 1 is a perspective view of an on-chip type terahertz oscillator according to example embodiments. FIG. 2 is a cross-sectional view of the on-chip type terahertz oscillator taken long a line II-II' of FIG. 1.

Referring to FIGS. 1 and 2, the on-chip type terahertz oscillator may include electron emitter 15, anode 16, oscillating circuit 17, collector 18, and/or output unit 19. Electron emitter 15, anode 16, oscillating circuit 17, collector 18, and/or output unit 19 may be sequentially disposed on first insulating layer 120.

Figure 3:
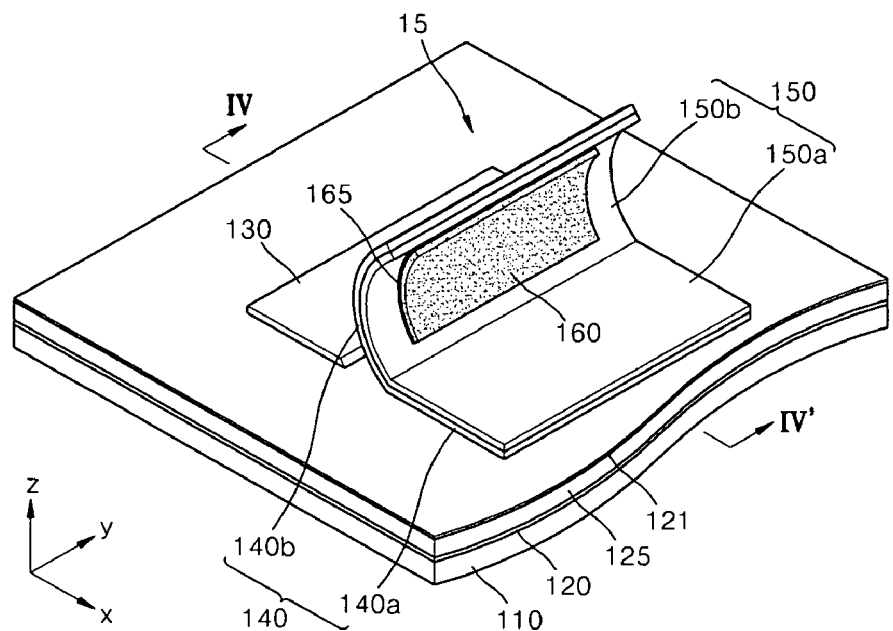
FIG. 3 is an enlarged perspective view of an electron emitter of FIGS. 1 and 2, according to example embodiments.
Figure 4:
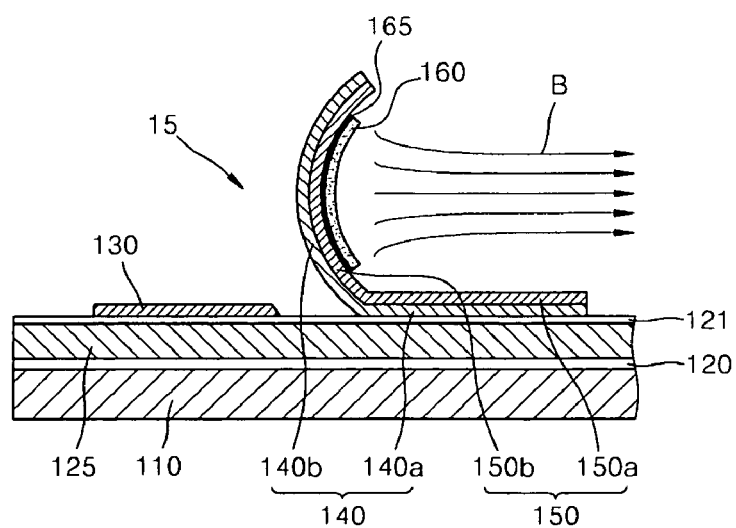
FIG. 4 is a cross-sectional view of the electron emitter taken along a line IV-IV' of FIG. 3.

FIG. 3 is an enlarged perspective view of electron emitter 15 of FIGS. 1 and 2, according to example embodiments. FIG. 4 is a cross-sectional view of electron emitter 15 taken along a line IV-IV' of FIG. 3.

Referring to FIGS. 3 and 4, electron emitter 15 may include second insulating layer 140 disposed on first insulating layer 120, cathode 150 disposed on second insulating layer 140, and/or electron emitting material layer 160 disposed on cathode 150. First insulating layer 120 may be formed on substrate 110. Substrate 110 may be generally formed of silicon, but is not limited thereto. First insulating layer 120 may be formed of, for example, silicon oxide, or alternatively may be formed of an insulating material, such as a silicon nitride.

Second insulating layer 140 may be disposed on first insulating layer 120. Second insulating layer 140 may include second supporting portion 140a disposed parallel to first insulating layer 120, and/or second curved portion 140b extending from second supporting portion 140a in a direction perpendicular to first insulating layer 120. Second curved portion 140b may be formed to have a curved shape that extends from a side of second supporting portion 140a in the direction perpendicular to first insulating layer 120 (e.g., the +z direction). Second curved portion 140b may be convex in an opposite direction (e.g., the −x direction) to a direction in which electron beam 'B' may be emitted (e.g., the +x direction). Second curved portion 140b may have a curvature (that may or may not be predetermined) with respect to the y-axis, and the curvature may vary in various forms. Second insulating layer 140 may be formed of silicon oxide and/or silicon nitride, but is not limited thereto. In addition, second insulating layer 140 may be formed of various insulating materials.

Cathode 150 may be disposed on second insulating layer 140. Cathode 150 may include first supporting portion 150a formed on second supporting portion 140a, and/or first curved portion 150b extending from first supporting portion 150a and/or formed on an inner surface of second curved portion 140b. First curved portion 150b may be formed to have a curved shape that may extend in the direction perpendicular to first insulating layer 120 (e.g., the +z direction). That is, first curved portion 150b may be convex in the opposite direction (e.g., the −x direction) to the direction in which electron beam 'B' may be emitted (e.g., the +x direction). First curved portion 150b may have with a curvature (that may or may not be predetermined) with respect to the y-axis. Cathode 150 may be formed of metal. For example, cathode 150 may be formed of at least one of platinum (Pt) and molybdenum (Mo), but is not limited thereto. Cathode 150 may be a field emission type cathode, a thermionic electron emission type cathode, an optical excitation electron beam cathode, or the like.

Electron emitting material layer 160 may be disposed on cathode 150. Electron emitting material layer 160 may be formed on an inner surface of first curved portion 150b, which may be an electron emission surface. Thus, electron emitting material layer 160 may have a shape corresponding to first curved portion 150b. Electron emitting material layer 160 may include a material having excellent electron emission properties, for example, carbon nanotubes (CNTs), but is not limited thereto, that is, various materials may be included in electron emitting material layer 160. Catalyst layer 165 for growing an electron emitting material, such as CNTs, further may be formed on the inner surface of first curved portion 150b of cathode 150. Catalyst layer 165 may be formed of, for example, one or more of Invar, cobalt (Co), iron (Fe), nickel (Ni), and similar materials, but is not limited thereto.

Auxiliary electrode 130 may be disposed spaced apart from cathode 150 in the opposite direction (e.g., the −x direction) to the direction in which electron beam 'B' may be emitted (e.g., the +x direction). Auxiliary electrode 130 may be formed of the same material as that of cathode 150. Thus, auxiliary electrode 130 may be formed of, for example, at least one of platinum (Pt) and molybdenum (Mo), but is not limited thereto. Auxiliary electrode 130 may facilitate fixing or adjusting of a shape of cathode 150. That is, when a voltage (that may or may not be predetermined) may be applied between auxiliary electrode 130 and cathode 150, a shape of first curved portion 150b of cathode 150 may be fixed to have a curvature (that may or may not be predetermined). In addition, when the voltage applied between auxiliary electrode 130 and cathode 150 may be controlled, first curved portion 150b of cathode 150 may be adjusted to a shape having a desired curvature.

Electron emitter block 125 having a thickness (that may or may not be predetermined) further may be disposed between electron emitter 15 and first insulating layer 120. Electron emitter block 125 may be disposed on first insulating layer 120, and/or may adjust a height of electron beam 'B' emitted from electron emitter 15. Electron emitter block 125 may adjust a height of electron emitter 15 so that electron beam 'B' emitted from electron emitter 15 may pass above anode 16 and/or oscillating circuit 17. Electron emitter block 125 may be formed of, for example, silicon, but is not limited thereto. Third insulating layer 121 may be further formed between electron emitter block 125 and electron emitter 15. Third insulating layer 121 may improve the insulation between auxiliary electrode 130 and cathode 150. However, third insulating layer 121 may be omitted.

As described above, cathode 150 may include first curved portion 150b convex in the opposite direction (e.g., the −x direction) to the direction in which the electron beam 'B' may be emitted (e.g., +x direction). Electron emitting material layer 160 may be formed on the inner surface of first curved portion 150b, which may be an electron emission surface. Thus, as a voltage may be applied to cathode 150, electron beam 'B' emitted from electron emitting material layer 160 may be condensed and/or emitted in the form of a sheet beam parallel to the xy-plane.

Referring to FIGS. 1 and 2, anode 16, oscillating circuit 17, and/or collector 18 may be disposed on first insulating layer 120 at intervals (that may or may not be predetermined) in the direction in which electron beam 'B' may be emitted from electron emitter 15 (e.g., +x direction). Output unit 19 formed through first insulating layer 120 and/or substrate 110 may be formed between anode 16 and oscillating circuit 17. Electron emitter 15, anode 16, oscillating circuit 17, collector 18, and/or output unit 19 may be formed on first insulating layer 120 so as to realize an on-chip type terahertz oscillator.

Electron beam 'B' may be emitted from electron emitter 15 by a voltage applied between anode 16 and cathode 150, and/or anode 16 may control electron beam 'B'. Electron beam 'B' emitted from electron emitter 15 may be condensed in the form of a sheet beam, and/or may pass above anode 16. Anode 16 may include anode block 126 including plurality of first protrusions 126a that may be formed parallel to each other in a direction perpendicular to the direction in which electron beam 'B' may be emitted (e.g., +x direction). First protrusions 126a may be arranged at regular intervals. Heights of first protrusions 126a may be adjusted so that electron beam 'B' may pass above anode block 126. Anode block 126 may be formed of, for example, silicon, but is not limited thereto. Anode block 126 may be formed of various materials. First metal layer 161 further may be formed on first protrusions 126a.

Oscillating circuit 17 may oscillate an electromagnetic wave when electron beam 'B' passes anode 16 and/or oscillating circuit 17. Electron beam 'B' passing by anode 16 may pass above oscillating circuit 17. Oscillating circuit 17 may include oscillating circuit block 127, including plurality of second protrusions 127a that may be formed parallel to each other in a direction perpendicular to the direction in which electron beam 'B' may be emitted (e.g., +x direction). Second protrusions 127a may be disposed at regular intervals. The interval between second protrusions 127a may be smaller than the interval between first protrusions 126a. Electron beam 'B' passing by anode 16 may lose at least some of its energy while passing above oscillating circuit 17 due to a periodical arrangement of second protrusions 127a, and/or a terahertz electromagnetic wave absorbing this energy may oscillate while being emitted out of oscillator circuit 17. For example, a wavelength of the oscillating electromagnetic wave may be determined according to a velocity of electron beam 'B' and/or an arrangement of second protrusions 127a, that is, the interval, shapes, and/or sizes of second protrusions 127a. Second metal layer 171 may be further formed on second protrusions 127a.

Collector 18 may collect electron beam 'B' losing the energy while passing by oscillating circuit 17. Collector 18 may collect remaining electron beam 'B' after an interaction between electron beam 'B' and electromagnetic wave, and/or may block electron beam 'B' so that electron beam 'B' may not affect other elements. Collector 18 may include collector block 128 formed on first insulating layer 120 with a height (that may or may not be predetermined). Collector block 128 may be formed of, for example, silicon, but is not limited thereto. Third metal layer 181 may be further formed on collector block 128.

Output unit 19 may extract the terahertz electromagnetic wave oscillating in oscillating circuit 17 to outside of the on-chip type terahertz oscillator. That is, output unit 19 may output the electromagnetic wave that may oscillate in oscillating circuit 17 and/or may proceed from collector 18 toward anode 16 from a lower portion of substrate 110. Output unit 19 may be formed through a portion of first insulating layer 120 and/or substrate 110, that may be between anode 16 and oscillating circuit 17, and may include a through hole connected to the outside of the on-chip type terahertz oscillator. Output unit 19 may be formed by forming a slot through first insulating layer 120 and/or substrate 110 to extend in the direction perpendicular to the direction in which electron beam 'B' may be emitted (e.g., +x direction). A waveguide (not shown) may be disposed below a portion of substrate 110 in which output unit 19 may be formed, and/or may guide the electromagnetic wave transmitted through output unit 19 to the outside of the on-chip type terahertz oscillator.

Electron emitter 15, anode 16, oscillating circuit 17, collector 18, and/or output unit 19 may be manufactured in an on-chip structure using a silicon on insulator (SOI) substrate. Electron emitter block 125, anode block 126, oscillating circuit block 127, and/or collector block 128 may be integrally formed by patterning an upper silicon layer of the SOI substrate in a shape (that may or may not be predetermined).

Figure 5:
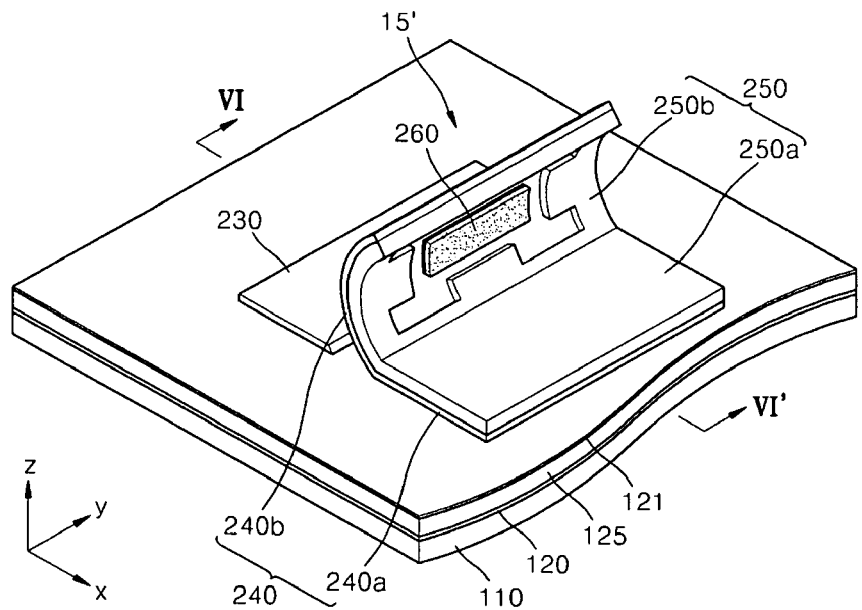
FIG. 5 is a perspective view of an electron emitter according to example embodiments.
Figure 6:
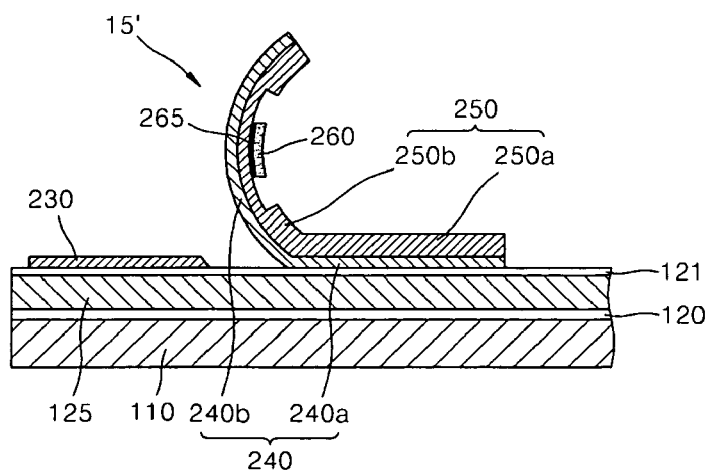
FIG. 6 is a cross-sectional view of the electron emitter taken along a line VI-VI' of FIG. 5.
Figure 7:
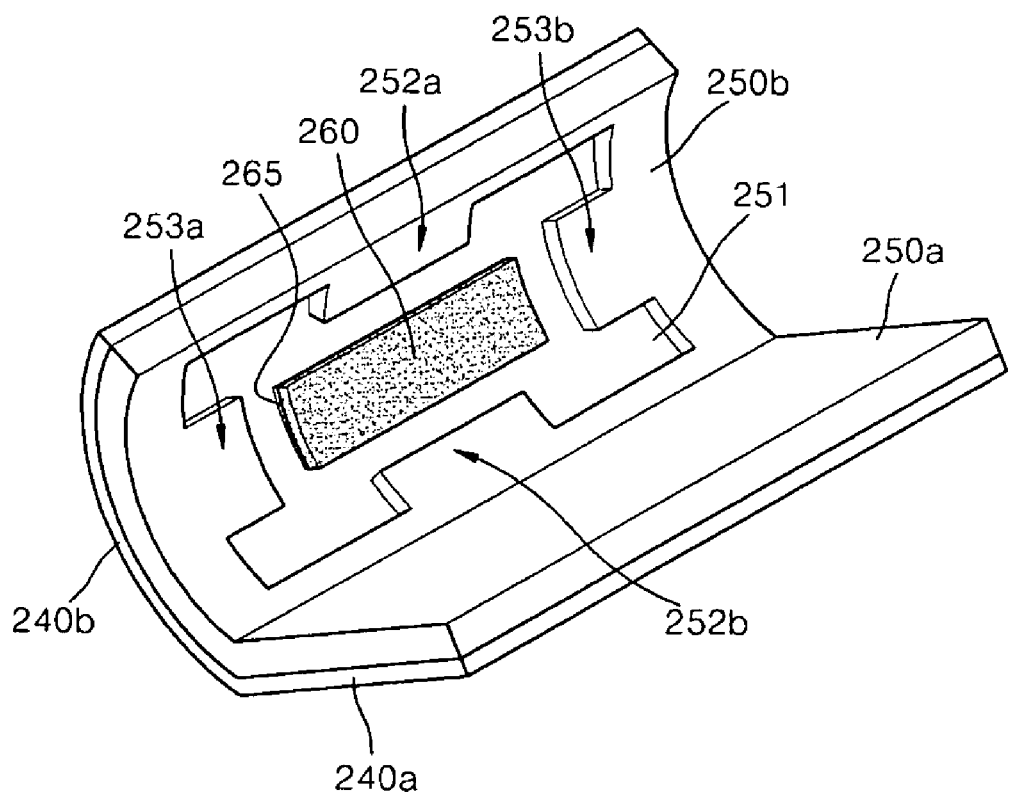
FIG. 7 is an enlarged perspective view of an internal surface of a first curved portion of FIG. 5, according to example embodiments.

FIG. 5 is a perspective view of electron emitter 15' according to example embodiments. FIG. 6 is a cross-sectional view of electron emitter 15' taken along a line VI-VI' of FIG. 5. FIG. 7 is an enlarged perspective view of an internal surface of first curved portion 250b of FIG. 5, according to example embodiments. Hereinafter, electron emitter 15' will be described in terms of differences from the above-described example embodiments.

Referring to FIGS. 5 through 7, electron emitter 15' may include second insulating layer 240 formed on first insulating layer 120, cathode 250 formed on second insulating layer 240, and/or electron emitting material layer 260 formed on cathode 250. Second insulating layer 240 may include second supporting portion 240a disposed parallel to first insulating layer 120, and/or second curved portion 240b extending from second supporting portion 240a in a direction perpendicular to first insulating layer 120. Second curved portion 240b may be formed to have a curved shape that extends in the direction perpendicular to first insulating layer 120 (e.g., the +z direction).

Cathode 250 may be disposed on second insulating layer 240. Cathode 250 may include first supporting portion 250a formed on second supporting portion 240a, and/or first curved portion 250b extending from first supporting portion 250a and/or formed on an inner surface of second curved portion 240b. First curved portion 250b may be formed to have a curved shaped that extends in the direction perpendicular to first insulating layer 120 (e.g., the +z direction).

Groove 251, having a depth (that may or may not be predetermined), may be formed in the inner surface of first curved portion 250b of cathode 250. First and second protrusions 252a and 252b, protruding toward groove 251, may be formed on the inner surface of first curved portion 250b of cathode 250 so as to face each other. Third and fourth protrusions 253a and 253b, protruding toward groove 251, may be formed on the inner surface of first curved portion 250b of cathode 250 so as to face each other. First protrusion 252a and/or second protrusion 252b may be arranged in a perpendicular direction to third protrusion 253a and/or fourth protrusion 253b. For example, first protrusion 252a and/or second protrusion 252b may be arranged in the y-axis direction, and/or third protrusion 253a and/or fourth protrusion 253b may be arranged in the z-axis direction. When first protrusion 252a, second protrusion 252b, third protrusion 253a, and/or fourth protrusion 253b may be formed, groove 251 may have an approximately dumbbell shape. Cathode 250 may be a field emission type cathode, a thermionic electron emission type cathode, an optical excitation electron beam cathode, or the like.

Electron emitting material layer 260 may be formed on cathode 250. Electron emitting material layer 260 may be formed on a central bottom surface of groove 251 formed in the inner surface of first curved portion 250b of cathode 250. When groove 251 having an approximately dumbbell shape may be formed in the inner surface of first curved portion 250b of cathode 250, and/or electron emitting material layer 260 may be formed on the bottom surface of groove 251, a sheet beam having a uniform shape may be emitted. Catalyst layer 265 for growing an electron emitting material may be further formed on the central bottom surface of groove 251 formed in the inner surface of first curved portion 250b of cathode 250. Auxiliary electrode 230 may be disposed spaced apart from cathode 250 in the opposite direction (e.g., the −x direction) to the direction in which electron beam 'B' may be emitted (e.g., the +x direction).

Figure 8:
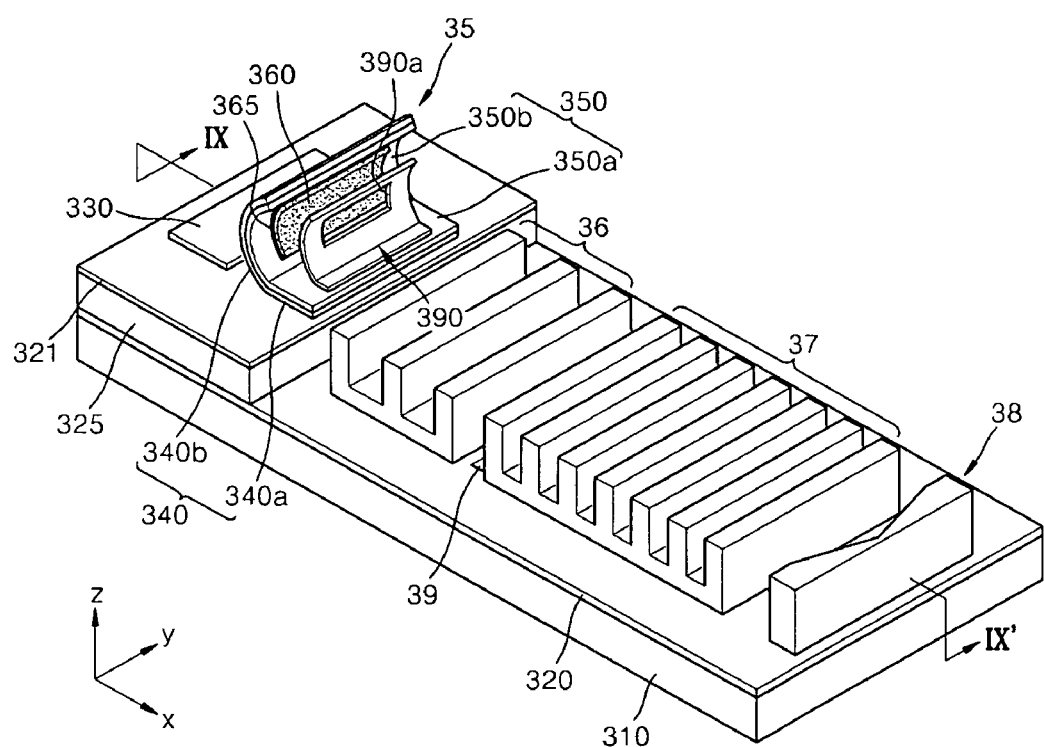
FIG. 8 is a perspective view of an on-chip type terahertz oscillator according to example embodiments.
Figure 9:
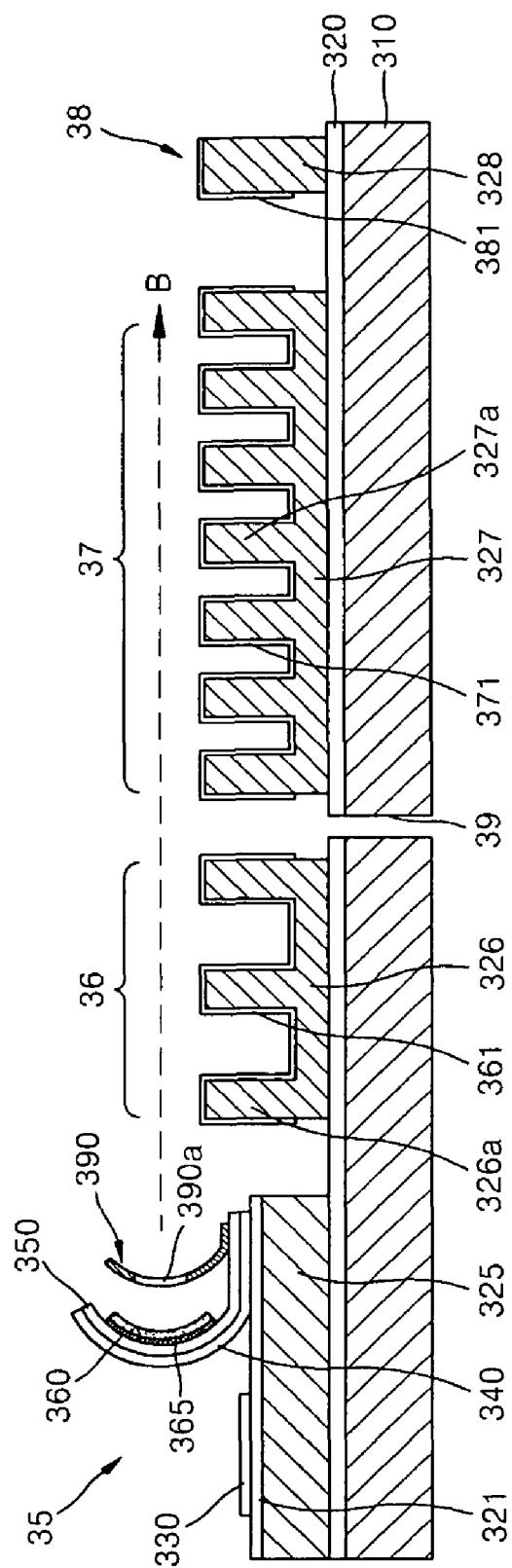
FIG. 9 is a cross-sectional view of the on-chip type terahertz oscillator taken long a line IX-IX' of FIG. 8.

FIG. 8 is a perspective view of an on-chip type terahertz oscillator according to example embodiments. FIG. 9 is a cross-sectional view of the on-chip type terahertz oscillator taken long a line IX-IX' of FIG. 8. Hereinafter, the on-chip type terahertz oscillator will be described in terms of differences from the above-described example embodiments.

Referring to FIGS. 8 and 9, the on-chip type terahertz oscillator may include electron emitter 35, gate 390, anode 36, oscillating circuit 37, collector 38, and/or output unit 39, that may be sequentially disposed on first insulating layer 320 formed on substrate 310, in the direction in which an electron may be emitted (e.g., +x direction). Electron emitter 35 may include second insulating layer 340 formed on first insulating layer 320, cathode 350 formed on second insulating layer 340, and/or electron emitting material layer 360 formed on cathode 350.

Second insulating layer 340 may include second supporting portion 340a disposed parallel to first insulating layer 320, and/or second curved portion 340b extending from second supporting portion 340a in a direction perpendicular to first insulating layer 320. Cathode 350 may include first supporting portion 350a formed on second supporting portion 340a, and first curved portion 350b extending from first supporting portion 350a and/or formed on an inner surface of second curved portion 340b. Cathode 350 may be a field emission type cathode, a thermionic electron emission type cathode, an optical excitation electron beam cathode, or the like. Electron emitting material layer 360 may be formed on an inner surface of first curved portion 350b, which may be an electron emission surface. Catalyst layer 365 for growing an electron emitting material such as CNTs may be formed on the inner surface of first curved portion 350b of cathode 350. Auxiliary electrode 330 may be disposed spaced apart from cathode 350 in the opposite direction (e.g., the −x direction) to the direction in which electron beam 'B' may be emitted (e.g., the +x direction). Since second insulating layer 340, cathode 350, electron emitting material layer 360, and/or auxiliary electrode 330, respectively, may be substantially the same as second insulating layer 140, cathode 150, electron emitting material layer 160, and/or auxiliary electrode 130 described above, their detailed description is not repeated. Groove 251 having an approximately dumbbell shape, as shown in FIG. 7, may be formed in the inner surface of first curved portion 350b of cathode 350.

Electron emitter block 325 having a thickness (that may or may not be predetermined) may be further disposed between electron emitter 35 and first insulating layer 320. Electron emitter block 325 may be formed of, for example, silicon, but is not limited thereto. Third insulating layer 321 may be further formed between electron emitter block 325 and electron emitter 35.

Gate 390 may be disposed between electron emitter 35 and anode 36. Gate 390 may emit an electron beam from electron emitter 35 by a voltage applied between gate 390 and cathode 350. Gate 390 may include gate hole 390a formed through gate 390 so as to transmit an electron beam emitted from electron emitter 35 through gate hole 390a. Gate hole 390a may have, for example, a rectangular shape so as to transmit an electron beam condensed in a sheet shape. Gate 390 may be disposed on first supporting portion 350a of cathode 350 in a direction perpendicular to first insulating layer 320. For example, gate 390 may have a curved shape corresponding to first curved portion 350b of cathode 350.

Anode 36 may control an electron beam emitted from electron emitter 35 and/or transmitted through gate hole 390a. The electron beam transmitted through gate hole 390a may pass above anode 36. Anode 36 may include anode block 326, including plurality of first protrusions 326a that may be formed parallel to each other in a direction perpendicular to the direction in which electron beam 'B' may be emitted (e.g., the +x direction). First protrusions 326a may be arranged at regular intervals. First metal layer 361 may be further formed on first protrusions 326a. Oscillating circuit 37 may oscillate an electromagnetic wave when electron beam 'B' may pass by anode 36. Electron beam 'B' passing by anode 36 may pass above oscillating circuit 37. Oscillating circuit 37 may include oscillating circuit block 327, including plurality of second protrusions 327a that may be formed parallel to each other in a direction perpendicular to the direction in which electron beam 'B' may be emitted (e.g., the +x direction). Second protrusions 327a may be arranged at regular intervals. The interval between second protrusions 327a may be smaller than the interval between first protrusions 326a. Second metal layer 371 may be further formed on second protrusions 327a.

Collector 38 may collect electron beam 'B' losing the energy while passing by oscillating circuit 37. Collector 38 may include collector block 328 formed on first insulating layer 320 with a height (that may or may not be predetermined). Third metal layer 381 further may be formed on collector block 328. Output unit 39 may extract the terahertz electromagnetic wave oscillating in oscillating circuit 37 to outside of the on-chip type terahertz oscillator. Output unit 39 may be formed through a portion of first insulating layer 320 and/or substrate 310, disposed between anode 36 and oscillating circuit 37, and/or may include a through hole connected out of the on-chip type terahertz oscillator.

FIGS. 10 through 17 are cross-sectional views of a method of manufacturing an electron emitter according to example embodiments.

Figure 10:
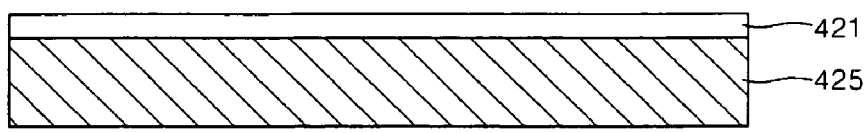
FIGS. 10 through 17 are cross-sectional views of a method of manufacturing an electron emitter, according to example embodiments.

Referring to FIG. 10, substrate 425 may be prepared. Substrate 425 may be a silicon substrate, but is not limited thereto. Various materials may be used to form substrate 425. Second insulating layer 421 may be formed on substrate 425. Second insulating layer 421 may be formed by thermally oxidizing substrate 425 formed of, for example, silicon oxide, or alternatively may be formed of an insulating material such as a silicon nitride.

Figure 11:
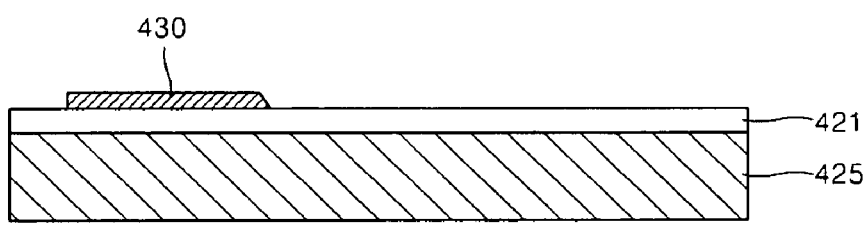
Figure 12:
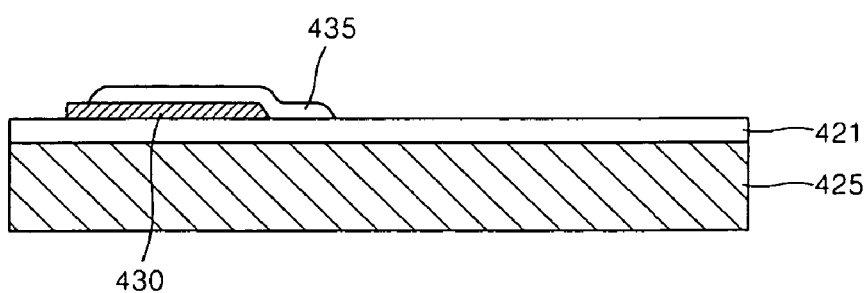

Referring to FIG. 11, auxiliary electrode 430 may be formed on second insulating layer 421. Auxiliary electrode 430 may be formed of, for example, at least one of platinum (Pt) and molybdenum (Mo), but is not limited thereto. Auxiliary electrode 430 may be formed by depositing a metal layer including at least one of Pt and Mo on second insulating layer 421 and then patterning the metal layer. Referring to FIG. 12, sacrificial layer 435 may be formed on auxiliary electrode 430 and/or second insulating layer 421. Sacrificial layer 435 may be formed of, for example, a zinc oxide (ZnO), but is not limited thereto. Sacrificial layer 435 may be formed by forming, for example, a ZnO layer on second insulating layer 421 to cover auxiliary electrode 430 and then patterning the ZnO layer. Alternatively, only sacrificial layer 435 may be formed on second insulating layer 421, and auxiliary electrode 430 may not be formed.

Figure 13:
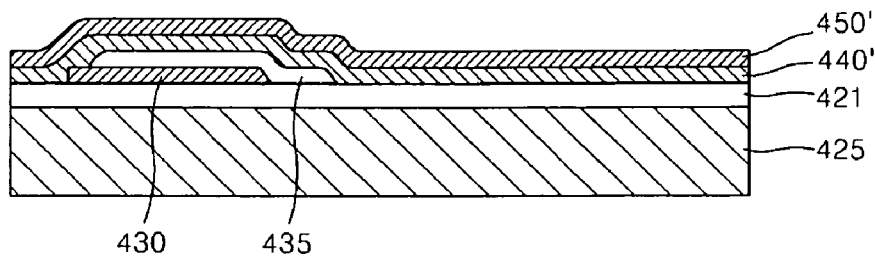
Figure 14:
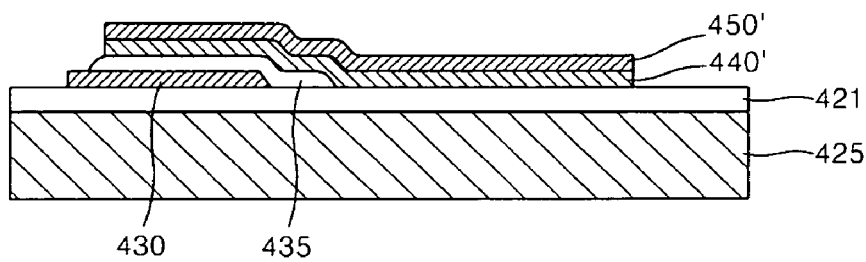

Referring to FIG. 13, first insulating material layer 440' may be formed to cover sacrificial layer 435 and/or second insulating layer 421, and/or cathode material layer 450' may be formed on first insulating material layer 440'. First insulating material layer 440' may be formed of a silicon oxide or silicon nitride, but is not limited thereto. Cathode material layer 450' may be formed of the same material of that of auxiliary electrode 430. Cathode material layer 450' may be formed of, for example, at least one of Pt and Mo, but is not limited thereto. Although not illustrated in FIG. 13, groove 251 having a depth (that may or may not be predetermined), as shown in FIG. 7, may be formed in cathode material layer 450' disposed on sacrificial layer 435. Then, referring to FIG. 14, cathode material layer 450' and/or first insulating material layer 440' may be etched (e.g., cathode material layer 450' and first insulating material layer 440' may be etched sequentially). An end of sacrificial layer 435 may be exposed through cathode material layer 450' and/or first insulating material layer 440'.

Figure 15:
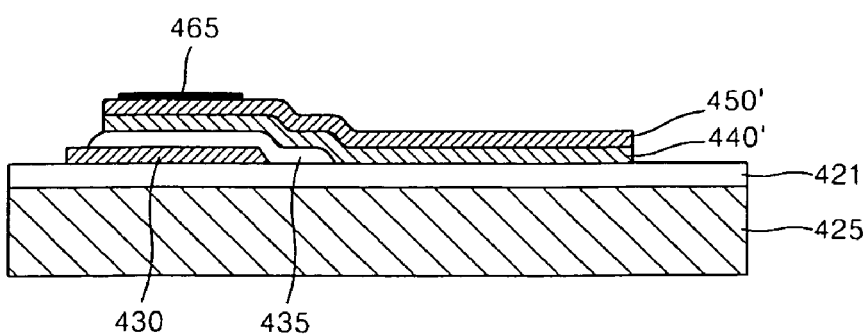

Referring to FIG. 15, catalyst layer 465 may be further formed on cathode material layer 450'. Catalyst layer 465 may be a seed layer for forming electron emitting material layer 460 (see FIG. 17) that will be described later. Catalyst layer 465 for growing an electron emitting material such as CNTs may be formed of, for example, Invar, Co, Fe, Ni, or the like, but is not limited thereto.

Figure 16:
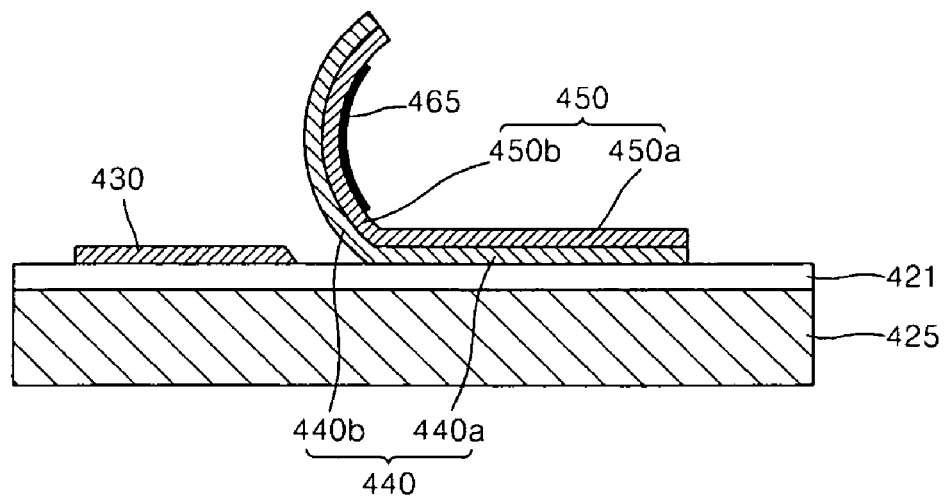

Referring to FIG. 16, sacrificial layer 435 may be etched in order for it to be removed. Sacrificial layer 435 may be removed using, for example, a wet etching method. When sacrificial layer 435 may be removed, first insulating material layer 440' and/or cathode material layer 450', that were formed above sacrificial layer 435, may extend in a direction perpendicular to second insulating layer 421 and/or may be curved due to a stress difference between first insulating material layer 440' and cathode material layer 450'. Thus, first insulating layer 440 may be formed on second insulating layer 421, and/or may include second supporting portion 440a formed on second insulating layer 421, and/or second curved portion 440b that may extend from second supporting portion 440a in a direction perpendicular to second insulating layer 421. Cathode 450 may be formed on first insulating layer 440, and/or may include first supporting portion 450a disposed on second supporting portion 440a, and/or first curved portion 450b that may extend from first supporting portion 450a in a direction perpendicular to second insulating layer 421.

Figure 17:
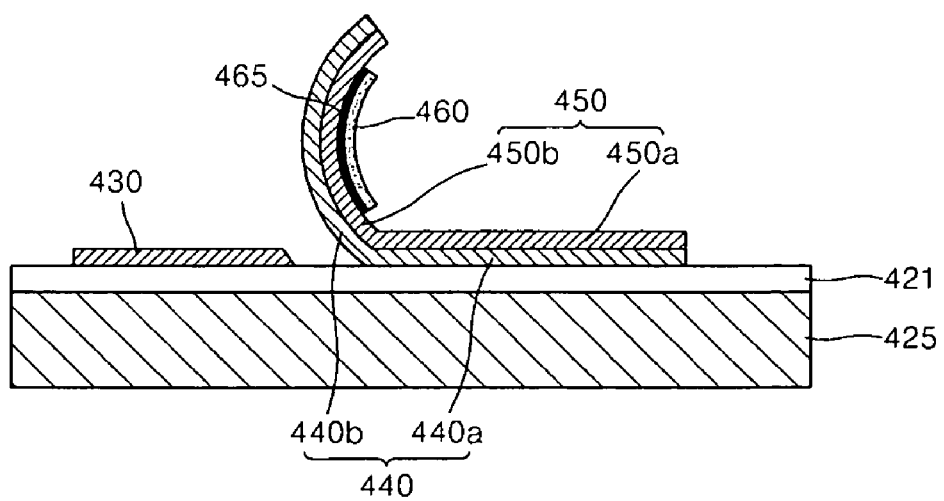

Referring to FIG. 17, electron emitting material layer 460 may be formed on an inner surface of first curved portion 450b of cathode 450. Electron emitting material layer 460 may be formed by growing CNTs from catalyst layer 465 by using, for example, a chemical vapor deposition (CVD) method. Alternatively, electron emitting material layer 460 may be formed without catalyst layer 465. In example embodiments, CNTs are just an example of material used to form electron emitting material layer 460, and various materials may be used to form electron emitting material layer 460. As shown in FIG. 15, electron emitting material layer 460 may be formed by forming catalyst layer 465 and then growing an electron emitting material from catalyst layer 465.

Likewise, while sacrificial layer 435 formed below first insulating material layer 440' may be removed, first insulating material layer 440' and/or cathode material layer 450' that were formed above sacrificial layer 435 may extend in a direction perpendicular to second insulating layer 421, and/or may be curved due to a stress difference between first insulating material layer 440' and cathode material layer 450'. Thus, first insulating layer 440, including second curved portion 440b, and cathode 450, including first curved portion 450b, may be formed. So far, the case where second insulating layer 421 may be formed on substrate 425 has been described. Alternatively, second insulating layer 421 may not be formed, or second insulating layer 421 may be formed only below auxiliary electrode 430.

As described above, according to example embodiments, since an electron beam emitted from an electron emitter may be condensed in the form of a sheet beam by using a cathode formed to have a curved shape and extend upwards, an electron beam condensing structure for a high current density may be realized. In addition, the electron emitter may be integrally manufactured with an anode, an oscillating circuit, a collector, and an output unit to constitute an on-chip type terahertz oscillator.

While example embodiments have been particularly shown and described, it will be understood by those of ordinary skill in the art that various changes in form and details may be made therein without departing from the spirit and scope of the present invention as defined by the following claims.

What is claimed is:

1. A terahertz oscillator, comprising:
    a first insulating layer;
    an electron emitter on the first insulating layer, adapted to emit an electron beam, and including a cathode;
    an anode, an oscillating circuit, and a collector sequentially spaced apart from each other on the first insulating layer in a direction in which the electron beam is emitted from the electron emitter, wherein the oscillating circuit converts energy of the electron beam to energy of an electromagnetic wave, and wherein the collector collects the electron beam;
    an output unit adapted to emit the electromagnetic wave from the oscillating circuit to outside of the terahertz oscillator; and
    an electron emitting material layer;
    wherein the cathode includes a first curved portion that extends in a direction perpendicular to the first insulating layer, and
    wherein the electron emitting material layer is on an inner surface of the first curved portion of the cathode.

2. The terahertz oscillator of claim 1, further comprising:
    a gate disposed between the cathode and the anode;
    wherein the gate includes a gate hole formed through the gate, and
    wherein the electron beam emitted from the electron emitter is transmitted through the gate hole.

3. The terahertz oscillator of claim 1, wherein the cathode further includes a first supporting portion parallel to the first insulating layer, and
    wherein the electron emitter further includes:
    a second insulating layer on an external surface of the cathode and including a second supporting portion on an external surface of the first supporting portion and a second curved portion on an external surface of the first curved portion.

4. The terahertz oscillator of claim 1, wherein the electron emitter further includes:
    an auxiliary electrode on the first insulating layer, in a direction opposite to the direction in which the electron beam is emitted, in such a manner as to be spaced apart from the cathode.

5. The terahertz oscillator of claim 1, wherein the first curved portion of the cathode includes a groove in the inner surface of the first curved portion,
    wherein the inner surface of the first curved portion includes first and second protrusions that protrude toward the groove so as to face each other, and
    wherein the inner surface of the first curved portion includes third and fourth protrusions that protrude toward the groove so as to face each other.

6. The terahertz oscillator of claim 5, wherein the first and second protrusions are arranged in a direction perpendicular to a direction in which the third and fourth protrusions are arranged.

7. The terahertz oscillator of claim 5, wherein the electron emitting material layer is on a bottom surface of the groove.

8. The terahertz oscillator of claim 1, wherein the cathode is a field emission type cathode, a thermionic electron emission type cathode, or an optical excitation electron beam cathode.

9. The terahertz oscillator of claim 1, wherein the electron emitter, the anode, the oscillating circuit, the collector, and the output unit are configured on the first insulating layer in an on-chip type terahertz oscillator.

10. The terahertz oscillator of claim 1, further comprising: a substrate on a lower surface of the first insulating layer.

11. The terahertz oscillator of claim 1, further comprising:
    an electron emitter block between the first insulating layer and the electron emitter.

12. The terahertz oscillator of claim 11, further comprising:
    a third insulating layer on the electron emitter block.

13. The terahertz oscillator of claim 1, wherein the output unit is in the first insulating layer, between the anode and the oscillating circuit, and
    wherein the output unit includes a through hole connected out of the terahertz oscillator.

14. The terahertz oscillator of claim 1, wherein the anode includes an anode block having a plurality of first protrusions arranged at a first regular interval, and
    wherein the oscillating circuit includes a plurality of second protrusions arranged at a second regular interval.

15. The terahertz oscillator of claim 14, wherein the first protrusions are arranged parallel to each other in a direction perpendicular to the direction in which the electron beam is emitted, and
    wherein the second protrusions are arranged parallel to each other in the direction perpendicular to the direction in which the electron beam is emitted.

16. The terahertz oscillator of claim 14, wherein the first regular interval is greater than the second regular interval.

17. The terahertz oscillator of claim 14, wherein the electron beam emitted from the electron emitter passes above the first protrusions, and
    wherein the electron beam emitted from the electron emitter passes above the second protrusions.

18. The terahertz oscillator of claim 1, wherein the collector includes a collector block.

* * * * *